United States Patent [19]
Overweg

[11] Patent Number: 5,917,395
[45] Date of Patent: Jun. 29, 1999

[54] MAIN FIELD MAGNET SYSTEM FOR A MAGNETIC RESONANCE DEVICE

[75] Inventor: Johannes A. Overweg, Uelzen, Germany

[73] Assignee: U.S. Philips Corporation, New York, N.Y.

[21] Appl. No.: 08/882,868

[22] Filed: Jun. 26, 1997

[30] Foreign Application Priority Data

Jul. 13, 1996 [DE] Germany ............................ 196 28 363

[51] Int. Cl.⁶ .............................. H01F 7/00; A61B 5/055
[52] U.S. Cl. ......................... 335/296; 600/410; 600/421; 324/319; 324/320; 335/216; 335/299
[58] Field of Search .................................. 600/410, 421, 600/422; 335/216, 296–299, 304; 324/318, 322, 319, 320

[56] References Cited

U.S. PATENT DOCUMENTS 5,519,372  5/1996  Palkovich et al. ...................... 600/421

FOREIGN PATENT DOCUMENTS

4417940A1   1/1994  Germany .

*Primary Examiner*—Ruth S. Smith
*Attorney, Agent, or Firm*—Dwight H. Renfrew, Jr.

[57] ABSTRACT

A magnetic resonance device has a main field magnet system which generates a steady magnetic field in an examination zone. The main field magnet system includes a yoke structure which consists of two yoke plates and a yoke wall interconnecting the two yoke plates, a pole block which is arranged inside the yoke device, and below an examination zone, and a coil which is arranged within the yoke system and above the examination zone. In order to ensure that a patient present in the examination zone can also undergo further treatments and is freely accessible during an MR examination, the inner space of the coil as well as the space between the coil and the examination zone remains free from components of the magnet system, the coil being constructed so as to be ring-shaped and encloses the examination zone essentially in such a manner that the patient is freely accessible from above and from the sides.

20 Claims, 2 Drawing Sheets

MAIN FIELD MAGNET SYSTEM FOR A MAGNETIC RESONANCE DEVICE

BACKGROUND OF THE INVENTION

1. Field of the Invention

The invention relates to a magnetic resonance (MR) device which includes a main field magnet system which generates a steady magnetic field in an examination zone and includes:

- a magnetizable upper yoke plate which is arranged above the examination zone,
- a magnetizable lower yoke plate which is arranged below the examination zone,
- a magnetizable yoke wall which interconnects the two yoke plates and encloses an inner space in conjunction with the yoke plates,
- a coil which is arranged between the examination zone and the upper yoke plate, and
- a magnetizable pole block which is arranged between the examination zone and the lower yoke plate.

The yoke plates, the yoke wall, the pole block and the coil together constitute the main field magnet system which generates a uniform, steady magnetic field. The yoke plates, the yoke wall and the pole block enclose an inner space and conduct the magnetic flux generated by the coil arranged in said inner space. The yoke plates, the yoke wall and the pole block consist of a magnetizable material, for example iron or steel, and hence offer little magnetic resistance to the magnetic flux.

2. Description of the Related Art

An MR device of the kind set forth is known from DE-A 44 17 940. The superconducting coil therein is arranged on a pole piece disposed between the upper yoke plate and the examination zone. Furthermore, a collimator plate is provided between this pole piece and the examination zone.

During an examination the patient is arranged on a patient table in the air gap between the collimator plate and the pole piece arranged underneath the examination zone. The collimator plate serves to optimize the homogeneity of the steady main magnetic field in the examination zone in which the part of the patient to be imaged is present. Because the collimator plate is situated at a small distance from and above the patient, however, the patient is then accessible only from the sides, for example for treatments performed simultaneously with the MR examination.

Contemporary MR imaging methods enable real-time formation of MR images. This possibility can be used notably for interventional applications, for example to provide the surgeon continuously with current MR images during an operation or to visualize the progress of the treatment continuously and instantaneously during minimal or non-invasive techniques.

SUMMARY OF THE INVENTION

It is an object of the present invention to provide an improved main field magnet system in order to improve an MR device of the kind set forth.

This object is achieved according to the invention in that the coil is constructed so as to be ring-shaped and encircles or encloses the examination zone essentially in such a manner that a patient present in the examination zone is freely accessible from the sides and from above.

The invention is based on the recognition of the fact that the magnetic flux need not be actively conducted by a magnetic structural component arranged directly above and below the imaging zone in order to achieve adequate magnetic field homogeneity in the examination zone, and that the necessary magnetic field homogeneity can also be achieved by increasing the diameter of the coil.

In the MR device according to the invention adequate magnetic field homogeneity is achieved essentially by the substantially larger diameter of the coil, in comparison with the known MR device, and the ring-shaped construction of the coil around the examination zone. Therefore, the collimator plate which is arranged directly above the patient in the known MR device can be dispensed with. Moreover, the superconducting coil in the MR system according to the invention is not arranged on a pole piece connected to the upper yoke plate. Thus, no further structural components of the main field magnet system are present neither within the coil nor between the coil and the patient. This allows for substantially unrestricted access to the patient from the sides and from above, so that one or more attending staff members can be present in the inner space enclosed by the yoke plates and the yoke wall and within the coil diameter during the treatment of the patient in the course of the MR examination.

In one embodiment of the invention the diameter of the coil amounts to at least two meters. The larger the diameter of the coil, the larger the examination zone will be, i.e. the larger the area will be in which the magnetic field has an homogeneity which suffices for the formation of MR images. In the case of a larger coil diameter, moreover, more persons have access to the patient and can also move unobstructedly. On the other hand, cost considerations restrict the maximum diameter of the coil. A compromise between an adequate magnetic field homogeneity, a high degree of freedom of movement of the persons attending the patient and accessibility of the patient on the one hand and the costs on the other hand is found for a coil having a diameter in the range of from two to four meters.

In a further embodiment of the invention the distance between the horizontal central plane of the coil and the upper side of the pole block corresponds to approximately half the radius of the coil. Below the examination zone there is established a magnetic field which is a mirror image, relative to the horizontal plane in which the upper end face of the pole block is situated, of the magnetic field generated above the examination zone by the superconducting coil, as if a further coil is present below the examination zone. Thus, in the examination zone approximately the magnetic field of a Helmholtz coil pair is obtained, which pair obtains its highest field homogeneity if the distance between the coils equals approximately the coil radius. Thus, the choice of the distance between the horizontal central plane of the coil and the upper side of the pole block according to the invention additionally contributes to enhanced field homogeneity in the examination zone.

The diameter of the pole block in a preferred embodiment of the invention amounts to approximately three times the diameter of the examination zone. For example, if the head of the patient is to be completely imaged, adequate field homogeneity in an examination zone having a diameter of approximately 30 cm is achieved by means of a pole block having a diameter of approximately 90 cm.

In a further embodiment of the MR device according to the invention, the upper yoke plate is provided with a central opening which serves notably for introducing further apparatus into the inner space. Further apparatus may be, for example apparatus for radiation therapy; in that case the progress of the radiation therapy treatment can be monitored real-time by the MR device according to the invention. For example, an X-ray apparatus which is ceiling-mounted, outside the inner space, on a movable arm can also be introduced into the inner space via the central opening, said X-ray apparatus enabling X-ray images to be formed simultaneously with the MR images. The central opening can also be used for the purpose of illumination in that, for example ceiling-mounted illumination means can be introduced into the inner space, or can at least illuminate the inner space, via the central opening.

The yoke wall in a preferred embodiment consists of a plurality of iron pillars which are arranged at a distance from one another and at equal distances from the examination zone. Equal distances and an identical as possible construction of the iron pillars are required to ensure that the magnetic field exhibits the highest homogeneity in the central area of the inner space in which the examination zone is situated. The distances between the iron pillars are chosen to be so large that the patient can be transported into the inner space and that the attending staff can simply enter the inner space.

The pole block in a further embodiment of the invention is provided at its center with a bore which extends in the vertical direction. The amount of magnetic flux conducted by the pole block can be adjusted via the diameter of the bore. Ultimately the homogeneity of the magnetic field in the examination zone is thus also influenced.

The coil in a preferred embodiment of the invention has superconducting properties, so that a particularly strong and uniform magnetic field can be generated.

BRIEF DESCRIPTION OF THE DRAWINGS

The invention will be described in detail hereinafter with reference to the drawing. Therein.

DETAILED DESCRIPTION OF THE PREFERRED EMBODIMENTS

Figure 1:
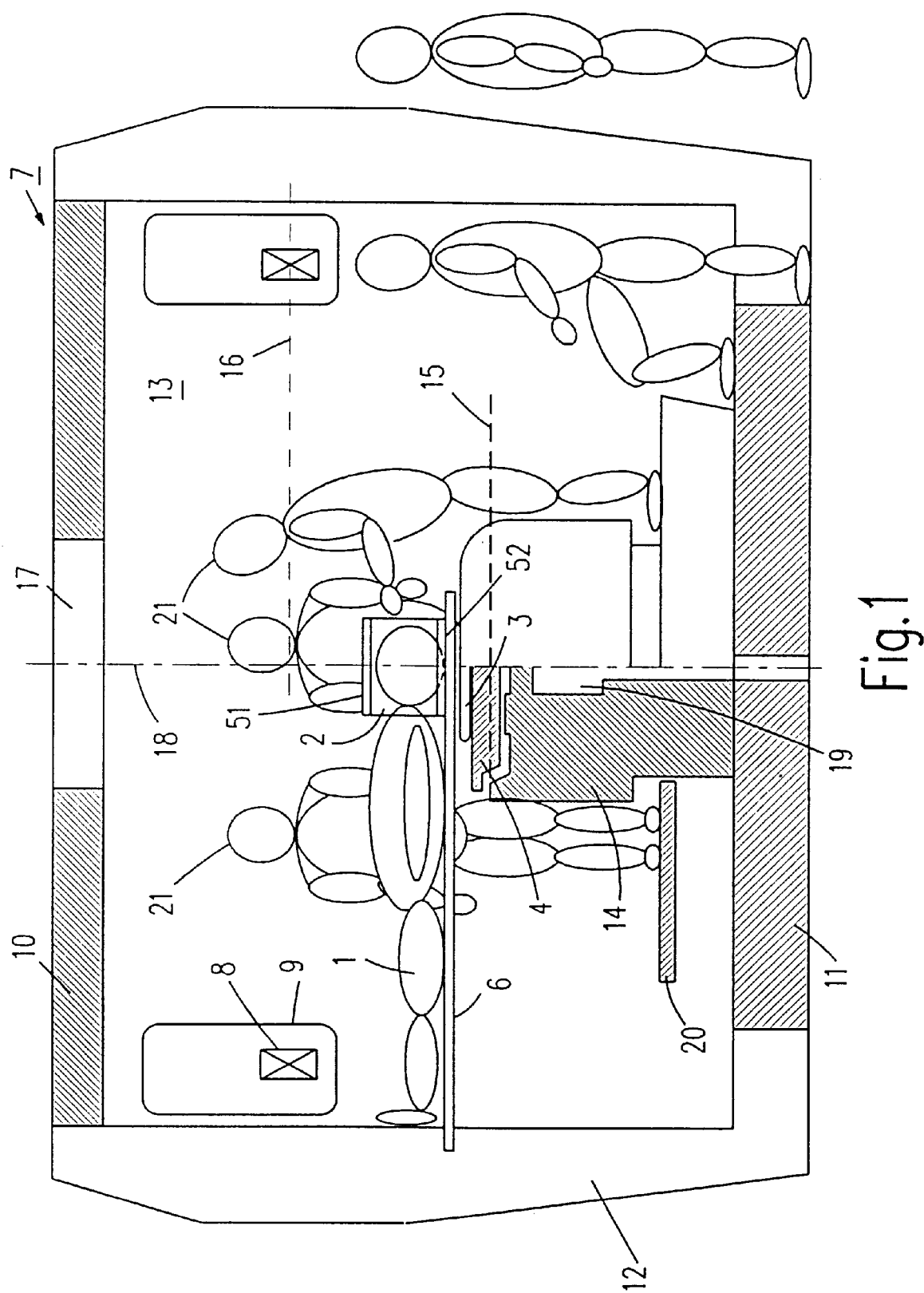
FIG. 1 is a cross-sectional view of an embodiment of the MR device according to the invention.

The reference numeral 1 in FIG. 1 denotes a patient arranged on a patient table 6 in the inner space 13 of an MR device according to the invention. In this case the patient 1 is arranged in a position suitable for the examination of the head which is arranged on the vertical symmetry axis 18 of the MR device in the examination zone 2. Below the head of the patient 1 there is provided a transmitter coil system 3 which is capable of generating a pulsed RF magnetic field in the examination zone 2. Therebelow there is provided a gradient coil system 4 which consists of a plurality of gradient coils and generates magnetic gradient fields which extend in the direction of the vertical axis 18 and on which a gradient is superimposed in one of the three spatial directions. The receiving coil system is in this case formed by a ring coil system consisting of two ring coils 51, 52, the ring coil 51 being arranged above whereas the ring coil 52 is arranged below the head of the patient 1. The ring coils 51, 52, being arranged symmetrically to the symmetry axis 18, detect the MR signals which are generated in the examination zone 2 and wherefrom the nuclear magnetization distribution in the examination zone 2 can be determined.

The examination zone 2 is exposed to a uniform, steady magnetic field which is generated by a main field magnet system 7. This system comprises first of all an annular superconducting coil 8 which is accommodated in a cryostat 9. The coil 8, being constructed as an air coil without core, is arranged above the examination zone 2, symmetrically with respect to the axis 18, in such a manner that the magnet field inside the coil 8 is oriented parallel to the vertical axis 18. The main field magnet system 7 also comprises an upper, magnetizable yoke plate 10 which is arranged above the coil 8 and serves as a quasi ceiling of the MR device, and also comprises a lower magnetizable yoke plate 11 which is arranged at a distance from and below the examination zone 2 and serves as a quasi floor of the MR device. The main field magnet system 7 also comprises a vertically extending yoke wall 12 which interconnects the yoke plates 10 and 11 and is made of a magnetizable material. The yoke wall in this case consists of a plurality of iron pillars. The two yoke plates 10 and 11 and the iron pillars 12 are arranged symmetrically to the axis 18, enclose the coil 8, the patient 1, the persons 21 attending the patient 1, and together enclose an inner space 13. They serve to conduct the magnetic flux of the magnetic field generated by the coil 8 and to shield the surroundings of the MR device from the stray fields occurring, notably from the coil 8.

Furthermore, between the lower yoke plate 11 and the gradient coil system 4 there is provided a pole block 14 which is constructed so as to be symmetrical with respect to the axis 18 and which also conducts the magnetic flux; the special shape of the pole block intensifies the homogenization of the main magnetic field in the examination zone 2.

For the purpose of illumination, or for introducing, for example an X-ray apparatus connected to a ceiling stand or a radiation therapy apparatus, the upper yoke plate 10 is provided with a central opening 17. The attending staff 21 stand on an additional inner floor 20 in the inner space 13 and have access to the head of the patient 1 from above and from all sides because of the construction of the MR device according to the invention.

Figure 2:
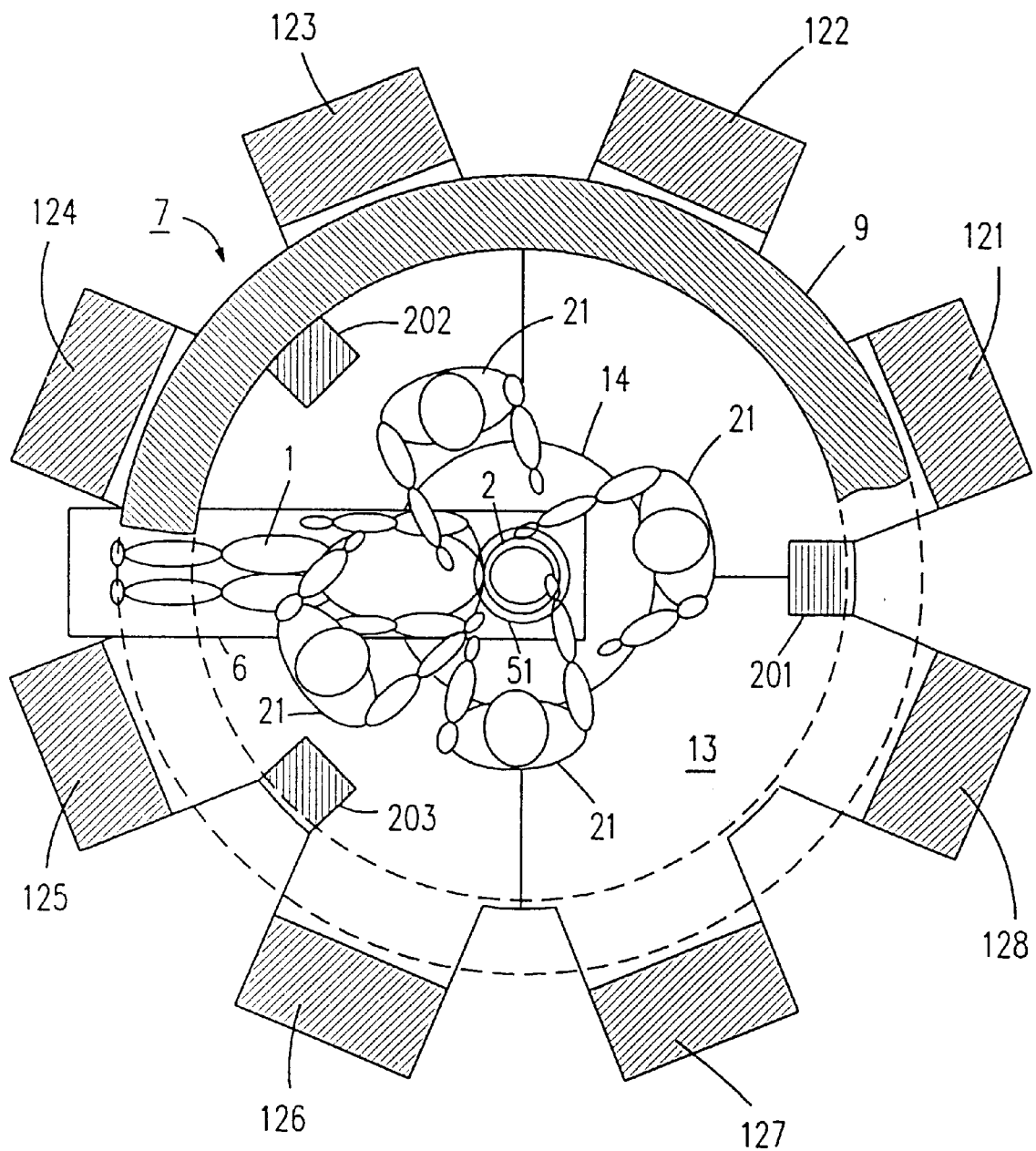
FIG. 2 is a plan view of the MR device shown in FIG. 1.

FIG. 2 is a plan view of the MR apparatus shown in FIG. 1. This Figure clearly shows the rotationally symmetrical construction of the main field magnet system 7. It also appears that the yoke wall 12 consists of eight iron pillars 121 to 128 which enclose the inner space 13. The attending staff can readily enter the inner space 13 via entrance steps 201, 202, 203 and the gaps between the iron pillars.

The coil 8 generates a strong, steady, uniform magnetic field along the axis 18. The yoke system consisting of the yoke plates 10 and 11, the yoke wall 12 and the pole block 14 serves as flux return for the magnetic field of the coil 8. The magnetic field in the examination zone 2 can be considered as the sum of the magnetic field generated by the coil 8 and the contribution made by the yoke device to the overall magnetic field. In the absence of this yoke system for the flux return, adequate magnetic field homogeneity could not be achieved in the examination zone 2. A series of parameters influences the variation and the strength of the magnetic field in the MR device shown, notably the size of the examination zone which is dependent on the size of the zone in which a magnetic field homogeneity is present which suffices for the formation of MR images.

It has been found according to the invention that the zone in which the steady magnetic field homogeneity is sufficient can be enlarged by increasing the coil diameter. The coil 8 of the embodiment shown has a diameter of approximately 3 m, allowing the staff 21 to move comfortably around the patient 1; on the other hand, in that case the cost and the weight of the coil 8 are not prohibitive. For the proportions of further parameters as described hereinafter an examination zone having a diameter of approximately 400 mm is obtained for such a coil diameter.

A further parameter is the number of ampere turns of the coil 8 which determines the strength of the magnetic field. Because of the non-linear behavior of the pole block, the magnetic field of the coil may not be arbitrarily strong. The iron of the pole block 14 is saturated as from a field strength of approximately 0.5 tesla. Beyond this field strength the pole block 14 does not contribute further to the effective magnetic field composed of the magnetic field of the coil and that of the yoke system. Lower-order magnetic field gradients generated by the coil 8 can then no longer be compensated by corresponding magnetic field gradients of the pole block in order to achieve overall a uniform magnetic field in the examination zone 2. The coil 8 of the embodiment shown is constructed so that the magnetic field has a strength of approximately 1 tesla in the examining zone.

A further possibility of increasing the magnetic field homogeneity resides in the construction of the pole block 14. If the contribution by the yoke system to the overall magnetic field is to be reduced, the simplest approach is to provide a central bore 19 in the pole block 14. The magnitude of the magnetic flux conducted by the pole block is thus reduced. The larger the diameter of this bore 19, the lower the strength of the central magnetic field will be. Alternatively, the outer diameter can also be reduced, notably at the lower area of the pole block 14. The attending staff 21 can then also stand around the patient 1 more comfortably. The diameter of the pole block, however, should not be too small in its upper area neighboring the examination zone 2. Higher-order magnetic field gradients would otherwise be superposed on the magnetic field at the center (i.e. the examination zone 2), said gradients originating from the contours of the pole block 14, so that the magnetic field would not be sufficiently uniform. The diameter of the pole block of the embodiment shown amounts to approximately 1150 mm, which corresponds to approximately 3 times the diameter of the examination zone 2.

A further parameter is the vertical distance between the central plane 16 of the coil 8 and the upper end plane 15 of the pole block 14. In this case this distance is preferably slightly larger than half the radius of the coil 8. This is based on the consideration that in the examination zone 2 the pole block 14 generates essentially a magnetic field which is a mirror image, relative to the plane 15, of the magnetic field of the coil 8 and hence quasi simulates a virtual coil arranged below the examination zone. This virtual coil and the coil 8 together constitute a configuration resembling that of a Helmholtz coil pair which achieves the best field homogeneity if the distance between the two coils corresponds approximately to the coil radius.

The profile of the pole block 14 which faces the examination zone 2 also influences the magnetic field homogeneity in the examination zone 2. The profile is designed so that the magnetic field gradients generated in the examination zone by the coil 8 are compensated by the magnetic field gradients of the pole block 14 in order to obtain a magnetic field which is uniform overall. It must be ensured that the structure of the pole block 14 does not generate higher-order magnetic field gradients which would limit the size of the examination zone 2. There are numerous possibilities for the design of the profile of the pole block 14, an advantageous solution being shown in which the edge facing the central zone is slightly raised and an annular, slightly raised area is present at approximately one third of the radius from the center.

Further parameters, having less effect on the variation of the magnetic field, are the vertical distance between the upper yoke plate 10 and the lower yoke plate 11 and the examination zone 2, the diameter of the central opening 17 in the upper yoke plate 10, and the aspect ratio of the cross-section of the coil 8. The distances between the yoke plates 10 and 11 and the examination zone 2 are chosen so that the attending staff 21 can comfortably enter the inner space 13 and move freely around the patient 1.

The number of iron pillars 121 to 128 constituting the yoke partition 12 can be chosen at random. However, in the case of a small number of iron pillars, the magnetic field inhomogeneity is increased for the same cross-section and the stray field outside the MR device is also increased.

The field homogeneity can be further improved by using further coils in the inner space. Further coils may be arranged above or below the patient. Additional coils, however, increase the complexity and the cost of the main field magnet system and reduce the patient accessibility.

In a practical embodiment notably the pole block and especially its surface facing the examination zone must be manufactured with a high precision in order to generate the magnetic field previously calculated by simulation. It may nevertheless be necessary to compensate manufacturing tolerances by means of appropriate correction elements. Such correction elements may be small iron parts which are rigidly or movably mounted on the surface of the pole block. Specially shaped small coils, arranged in the vicinity of the examination zone, may also serve as correction elements.

The MR device shown could also be constructed so as to be rotated through 90°, i.e. so that the yoke plates and the superconducting coil extend vertically and the yoke wall and the pole block horizontally. Such a device could be used, for example to form MR images of a patient in the upright position.

I claim:

1. A main field magnet system for generating a steady magnetic field in an examination zone of a magnetic resonance imaging device, said main field magnet system comprising:

a magnetizable upper yoke plate which is arranged above the examination zone, a magnetizable lower yoke plate which is arranged below the examination zone, a magnetizable yoke wall which interconnects the two yoke plates and encloses an inner space containing the examination zone in conjunction with the yoke plates, a magnetizable pole block which is arranged between the examination zone and the lower yoke plate, a coil which is arranged between the examination zone and the upper yoke plate, is ring-shaped with a horizontal central plane, and encircles the examination zone in such a manner that a patient present in the examination zone is freely accessible from the sides and from above.

2. The main magnet system of claim 1, wherein the diameter of the coil is at least two meters.

3. The main field magnet system of claim 2, wherein the distance between the horizontal central plane of the coil and an upper side of the pole block corresponds to approximately half the radius of the coil.

4. The main field magnet system of claim 3, wherein the diameter of the pole block is approximately three times the diameter of the examination zone.

5. The main field magnet system of claim 3, wherein the upper yoke plate has a central opening which serves for introducing further apparatus into the inner space.

6. The main field magnet system of claim 2, wherein the diameter of the pole block is approximately three times the diameter of the examination zone.

7. The main field magnet system of claim 2, wherein the upper yoke plate has a central opening which serves for introducing further apparatus into the inner space.

8. The main field magnet system of claim 2, wherein the yoke wall comprises a number of iron pillars which are arranged at a distance from one another and at equal distances from the examination zone.

9. The main field magnet system of claim 1, wherein the distance between the horizontal central plane of the coil and an upper side of the pole block corresponds to approximately half the radius of the coil.

10. The main field magnet system of claim 9, wherein the diameter of the pole block is approximately three times the diameter of the examination zone.

11. The main field magnet system of claim 9, wherein the upper yoke plate has a central opening which serves for introducing further apparatus into the inner space.

12. The main field magnet system of claim 9, wherein the yoke wall comprises a number of iron pillars which are arranged at a distance from one another and at equal distances from the examination zone.

13. The main field magnet system of claim 1, wherein the diameter of the pole block is approximately three times the diameter of the examination zone.

14. The main field magnet system of claim 1, wherein the upper yoke plate has a central opening which serves notably for introducing further apparatus into the inner space.

15. The main field magnet system of claim 1, wherein the yoke wall comprises a number of iron pillars which are arranged at a distance from one another and at equal distances from the examination zone.

16. The main field magnet system of claim 1, wherein at the center of the pole block there is a bore which extends in a vertical direction.

17. The main field magnet system of claim 1, wherein the coil is superconducting.

18. The main field magnet system of claim 1 wherein said coil has a diameter sufficient to achieve adequate magnetic field homogeneity.

19. The main field magnet system of claim 1 wherein said coil has a diameter between two and four meters.

20. The main field magnet system of claim 1 wherein said coil encircles the inner space.

* * * * *